United States Patent
Pathak

[11] Patent Number: 5,828,603
[45] Date of Patent: Oct. 27, 1998

[54] MEMORY DEVICE HAVING A POWER SUPPLY-INDEPENDENT LOW POWER CONSUMPTION BIT LINE VOLTAGE CLAMP

[75] Inventor: Jagdish Pathak, Los Altos Hills, Calif.

[73] Assignee: Atmel Corporation, San Jose, Calif.

[21] Appl. No.: 842,008

[22] Filed: Apr. 23, 1997

[51] Int. Cl.[6] .................................................. G11C 16/06
[52] U.S. Cl. .............................. 365/185.21; 365/185.18; 365/185.2; 365/203; 327/56
[58] Field of Search ........................... 365/185.21, 185.2, 365/185.18, 203; 327/56

[56] References Cited

U.S. PATENT DOCUMENTS

| | | | |
|---|---|---|---|
| 4,799,195 | 1/1989 | Iwahashi et al. | 365/185 |
| 4,879,682 | 11/1989 | Engles | 365/189.01 |
| 4,903,235 | 2/1990 | Kubota et al. | 365/104 |
| 4,916,665 | 4/1990 | Atsumi et al. | 365/185 |
| 4,999,812 | 3/1991 | Amin | 365/185 |
| 5,197,028 | 3/1993 | Nakai | 365/185 |
| 5,347,484 | 9/1994 | Kwong et al. | 365/49 |
| 5,535,161 | 7/1996 | Kato | 365/200 |
| 5,559,737 | 9/1996 | Tanaka et al. | 365/189.25 |
| 5,572,465 | 11/1996 | Bashir | 365/185.21 |
| 5,675,535 | 10/1997 | Jinbo | 365/185.2 |

*Primary Examiner*—David C. Nelms
*Assistant Examiner*—Hien Nguyen
*Attorney, Agent, or Firm*—Thomas Schneck; George B. F. Yee

[57] ABSTRACT

The present invention relates to a bit line clamping scheme for non-volatile memories. The bit line voltage is maintained at a desired voltage level so as to avoid read disturb effects, while being independent of power supply variations and consuming virtually no power. The invention makes practical memory devices which are designed for both high voltage (5 volt) operation and low voltage (3.3 and 2.5 volt) operation.

16 Claims, 6 Drawing Sheets

MEMORY DEVICE HAVING A POWER SUPPLY-INDEPENDENT LOW POWER CONSUMPTION BIT LINE VOLTAGE CLAMP

TECHNICAL FIELD

The present invention generally relates to non-volatile memories (e.g. EPROM, E²PROM, FLASH), and more specifically to a voltage clamping circuit for the bit line.

BACKGROUND ART

Non-volatile memory devices, such as EPROM, E²PROM, and FLASH, employ floating gate transistors as the memory storage elements. FIG. 4 shows a generic representation of a typical prior art memory device 100 consisting of an array of memory cells 110, addressed by row and column select lines, $ROW_1$–$ROW_n$, $COL_1$–$COL_m$. A sense amplifier 160 detects the data state of a selected memory cell by comparing the detected data signal at sense node 131 against a reference signal provided by a reference cell 150. A first input 161 to the sense amp receives the reference signal of the reference cell 150. The memory cell data is detected at a second input 162 of the sense amp 160. The data is detected through a combination of a load circuit 132 which is isolated from the bit line 135 by a bias circuit 130. The circuitry 130 and 132 detect the data state of the selected memory cell at a detection node 133 and produce a biasing potential at sense node 131 which is sensed by the sense amp 160.

A memory cell is selected by asserting a row and a column select line. A selected memory cell that is un-programmed will be conductive, with the result that sense node 131 will be driven to ground, causing the sense amp 160 to generate a first signal. Conversely, a selected memory cell that is programmed will be non-conductive, with the result that a charge build-up will occur at sense node 131, resulting in a voltage potential that is detected by the sense amp to produce a second output signal.

Numerous schemes for the load circuit 132 and bias circuit 130 are known. FIG. 5, for example, illustrates an example of load and detection circuitry as disclosed in U.S. Pat. No. 4,799,195. The load circuit 132' is shown consisting of an N-channel MOS transistor (NMOS) 202, having a drain and gate coupled to $V_{cc}$ and a source coupled to the sense node 131. The bias circuit 130' consists of an NMOS transistor pair 210, 212, a pair of inverters 214, 216, and an NMOS gating transistor 218. Each of the transistors 210, 212 is coupled with its drain-source path disposed between $V_{cc}$ and detection node 133 to detect the data state of a selected memory cell 110'. The inverters 214, 216 are connected between the selected memory cell and the gates of transistors 210 and 212 respectively. The inverters each invert the signal from the selected memory cell 110' sensed at detection node 133. A gating transistor 218 is coupled between the detection node and the sense node 131.

In FIG. 6, circuitry disclosed in U.S. Pat. No. 4,916,665 includes a detection circuit 130' and variations of a load circuit 132a'–132c'. Load circuit 132a' comprises an NMOS device having a drain and gate coupled to $V_{cc}$ and a source coupled to the sense node 131. Alternatively, load circuit 132b' comprises a P-channel (PMOS) device having a source coupled to $V_{cc}$, a gate coupled to ground, and a drain coupled to sense node 131. Load circuit 132c' comprises a PMOS device wherein $V_{cc}$ is coupled to a source and substrate thereof and the gate and drain are coupled to sense node 131. The detection circuit 130' consists of an NMOS transistor 310 having a source coupled to detection node 133 and a drain which receives $V_{cc}$. Gating transistor 312 is inserted in series between the detection node 133 and the sense node 131. Transistors 310, 312 are biased by a constant voltage supplied by a bias circuit consisting of transistor chain 314, 316, and 318.

U.S. Pat. No. 5,197,028 discloses load and detection circuitry 132', 130' as illustrated in FIG. 7. The detection circuit 130' includes chip enable transistors 402, 404. Transistor pairs 406a, 406b and 408a, 408b each comprise an inverter. A gating transistor 412 is connected between detection node 133 and sense node 131. The inverter inputs are coupled to the detection node. The output of inverter 406a, 406b is coupled to the gate of NMOS transistor 410, and the output of inverter 408a, 408b is coupled to the gate of gating transistor 412. A PMOS load transistor 414 receives $V_{cc}$ at its source and is coupled to sense node 131 at its drain and gate.

U.S. Pat. No. 5,559,737, as shown in FIG. 8, discloses a detection circuit 130' having an NMOS bit line charging transistor 502 coupled between $V_{cc}$ and detection node 133. An NMOS gating transistor 504 is coupled between the detection node and sense node 131. Both transistors are biased by a circuit, shown generically as bias circuit 506. The load circuit 132' consists of a PMOS transistor 508.

The floating gate of non-volatile memories are susceptible to a condition known as "read disturb" or soft write error, during lengthy read periods. Referring back to the generic diagram of FIG. 4, suppose that memory cell 112 has been selected, meaning that the $ROW_1$ select line is asserted with 5 volts and $COL_m$ is asserted with 5 volts. If the potential $V_{bitline}$ at detection node 133 rises above a certain level, the floating gate of memory cell 112 is likely to be subjected to soft write errors ("read disturb" effect). Although this potential is dependent on device technology and the specific structure of the memory cell, it is typically in the range of 1.2 volts to 1.8 volts with 1.5 volts being a commonly used value. Thus, it is desirable to maintain $V_{bitline}$ at or below 1.5 volts in order to prevent or at least minimize read disturb effects.

A gating transistor coupled between the detection node and the sense node, such as those exemplified in the prior art shown FIGS. 4–8, should be such that $V_{bitline}$ is limited to a maximum voltage of 1.5 volts. The voltage at node 133 is $V_{ref}$–$V_t$, where $V_{ref}$ is the biasing voltage applied to the control gate of the gating transistor (e.g. transistor 504 in FIG. 8) and $V_t$ is its threshold voltage. Typically $V_t$ is 0.7–1.0 volt, so that $V_{ref}$ should be fixed at 2.2–2.5 volts. As exemplified above, this is achieved by the use of active feedback circuits or a chain of series-coupled, diode-connected transistors. These prior art schemes have two shortcomings: they always burn power; and, since $V_{ref}$ is usually derived from $V_{cc}$ in some way, the prior art schemes are quite sensitive to variations in $V_{cc}$ thus adversely affecting their ability to maintain $V_{ref}$ at the proper potential, e.g. 2.2–2.5 volts.

Complicating the situation is the increasing usage of 5 volt, 3.3, and 2.5 volt systems, requiring these non-volatile memory devices to operate under multiple power supply environments. Practically speaking, memory devices will be exposed to power supplies that can vary anywhere between 2.5 volts and 6.0 volts. While it is a relatively simple matter to provide a stable $V_{ref}$ which is designed specifically either for a 5 volt system or for a 3.3 volt system, such prior art circuits cannot economically and effectively provide a steady $V_{ref}$ source that can be reliably interchanged between 5 volt and 3.3 volt systems. For example, U.S. Pat. No. 5,572,465 discloses a memory device which employs a circuit that detects whether the device is operating with a 5 volt or a 3.3 volt power supply. The circuitry requires a 3.3/5 volt detector which drives combinatorial logic circuitry to select between a $V_{cc}$ of 5 volts or a 3.3 volt reference voltage generator, thus providing the proper voltage level. The combinatorial logic is needed to ensure that only one power level is provided.

What is needed is a bit line clamping scheme which is insensitive to power supply variations. It is also desirous to have a clamping scheme which is simple in design and which consumes virtually no power.

In this disclosure, the term "clamp" and its derivative terms refer to a scheme for limiting a voltage potential to a maximum value, and is to be distinguished from a circuit which fixes a node at a certain voltage level or within a range of voltage levels.

SUMMARY OF THE INVENTION

A non-volatile memory device in accordance with the present invention includes at least one memory cell and row and column select lines for selecting a memory cell. The memory device includes a sense amp for sensing the data state of a selected memory cell. A load circuit and a depletion-mode transistor connected in series with a column select line of the selected memory cell operate to generate a potential corresponding to the data state of the selected memory cell, which in turn is input to the sense amp. The depletion-mode transistor is an NMOS device. The load circuit may either be a PMOS device or an NMOS device.

BEST MODE OF CARRYING OUT THE INVENTION

Figure 1:
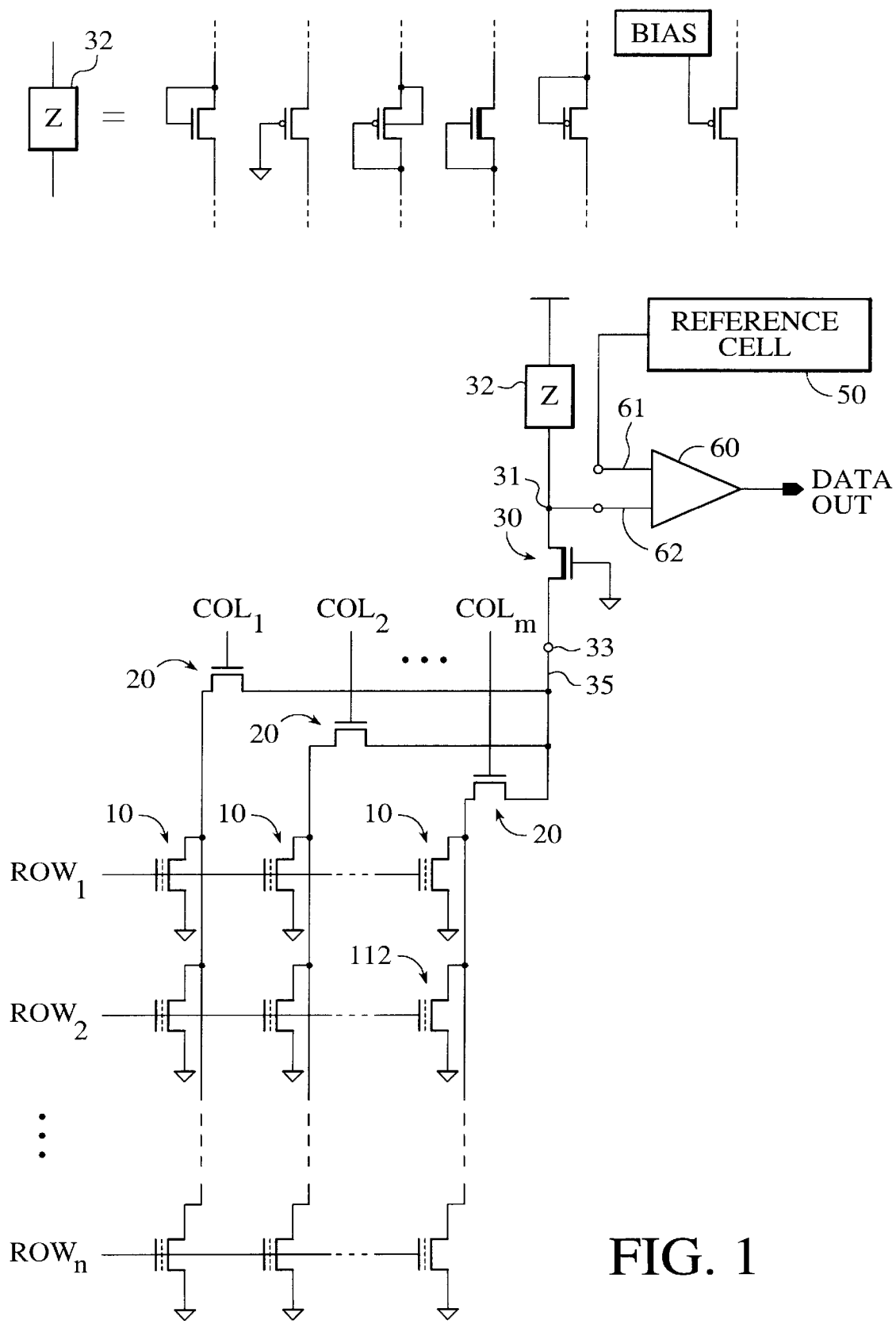
FIG. 1 shows a preferred embodiment of the present invention.

A memory device in accordance with the present invention, such as the device shown in FIG. 1, includes at least one memory cell 10 which is selected by asserting a row and a column select line. The drains of the column select transistors 20 are tied to node 33 of bit line 35. A gating transistor 30 has a first terminal coupled to node 33, a second terminal coupled to sense node 31, and a gate terminal coupled to ground potential. A load circuit such as transistor 32 is coupled between sense node 31 and $V_{cc}$. The sense node is coupled to an input 62 of sense amp 60. A reference cell 50 is coupled to input 61 of the sense amp. The output of the sense amp DATAOUT represents the logic level corresponding to the data stored in the selected memory cell. Construction of the sense amp and reference cell are known and well understood. As shown in FIG. 1, the load transistor 32 can be any one of a number of known circuits. Typical circuits are shown, but clearly any of a number of similar circuits may be used without departing from the scope and spirit of the invention.

In accordance with the present invention, the gating transistor 30 is an n-channel depletion-mode FET. The source terminal of the depletion device is coupled to the bit line 35 at node 33, the drain terminal is coupled to the sense node 31, and the control gate is coupled to ground.

Figure 2A:
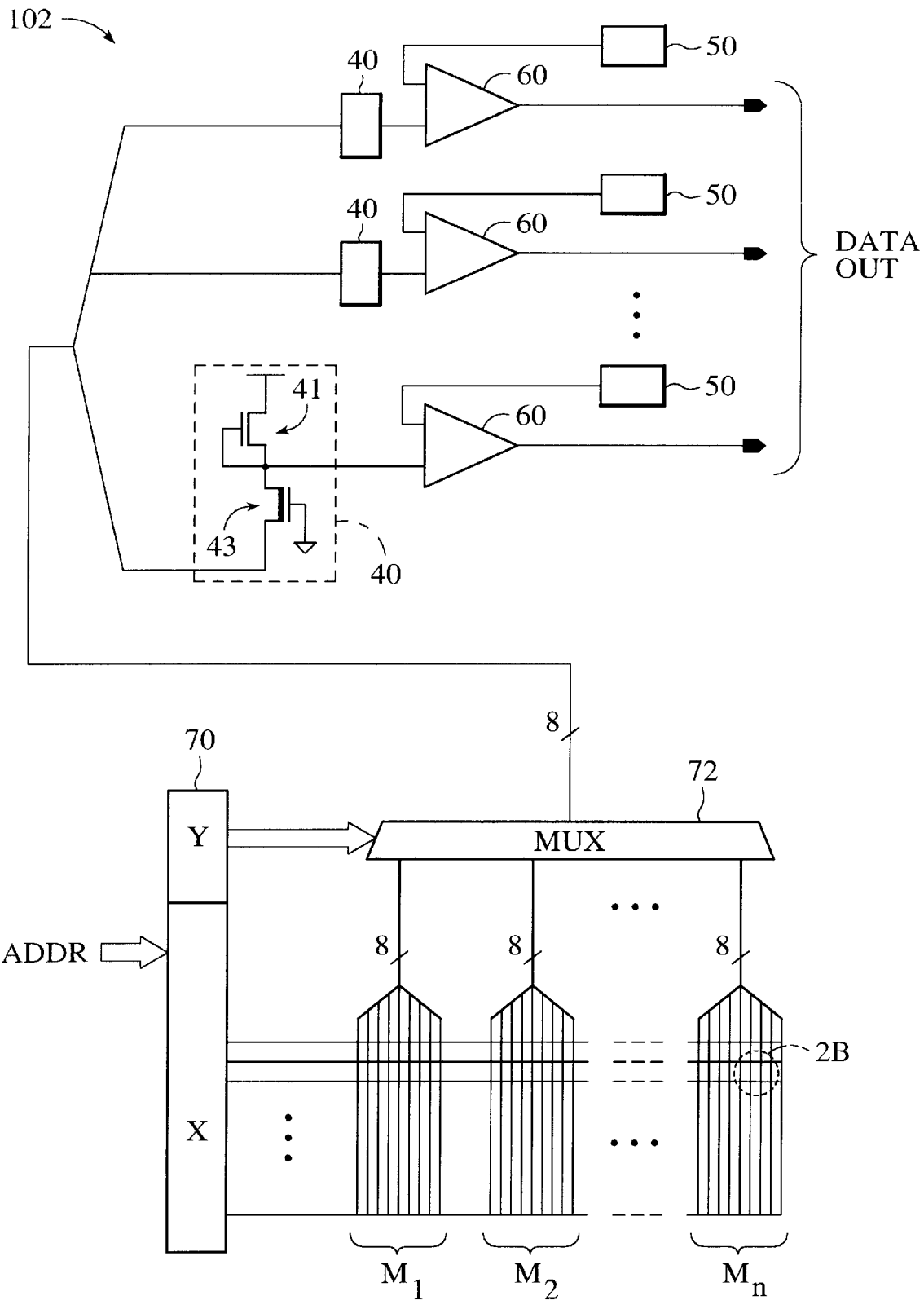
FIGS. 2A and 2B depicts a second embodiment of the present invention.
Figure 2B:
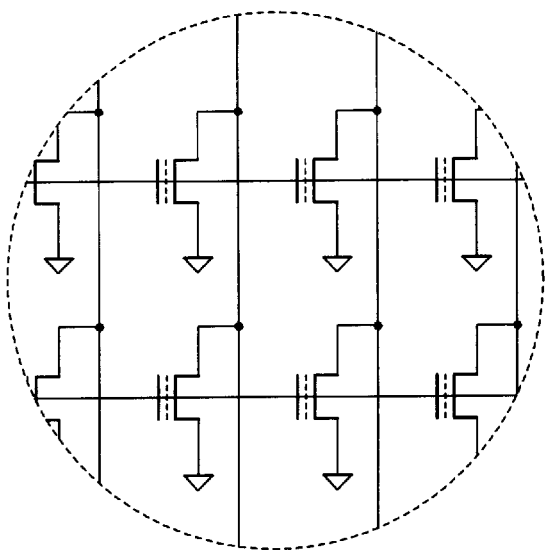

In a second embodiment of the memory device of the present invention, shown in FIGS. 2A and 2B, the memory cells are grouped eight bits at a time to form a plurality of rows of byte-organized memory $M_1$–$M_n$. An address which identifies a byte of memory is received by a decoder 70 which decodes the address and asserts the corresponding row address line X and generates a column select signal Y. The column select signal serves as a selector input to a multiplexer 72 to select the group of columns $M_1$–$M_n$ corresponding to the address.

Each of the eight bit lines exiting the multiplexer 72 feeds into a detection circuit 40 to detect the data state of its corresponding memory cell. The output of each detection circuit 40 feeds into a sense amp 60 which compares the detected signal against a reference 50 and outputs the proper logic level.

Each detection circuit 40 includes a load transistor 41 coupled between $V_{cc}$ and an input to the sense amp. A depletion-mode NMOS transistor 43 is coupled between the sense amp input and its corresponding bit line. The control gate of the depletion device 43 is coupled to ground potential. The elements of the detection circuit, therefore, are arranged in the same manner as illustrated in FIG. 1.

Figure 3:
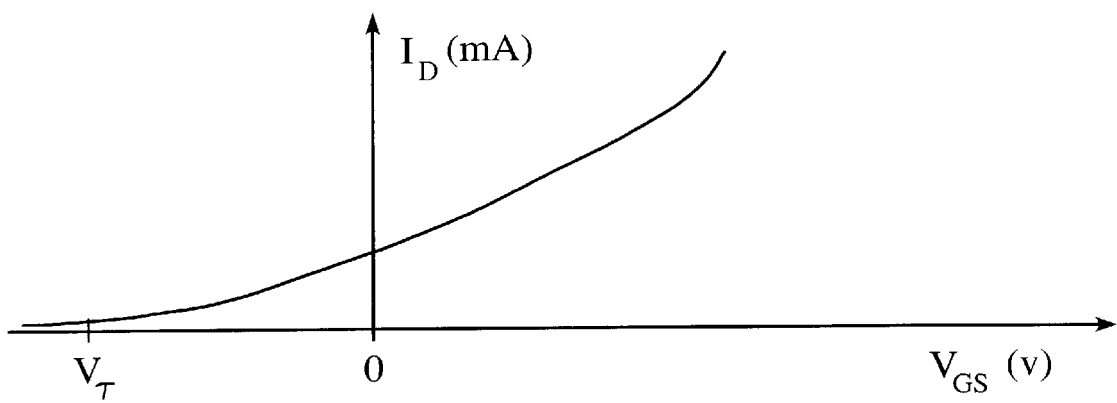
FIG. 3 is a typical transfer curve of an NMOS depletion-mode device.
Figure 4:
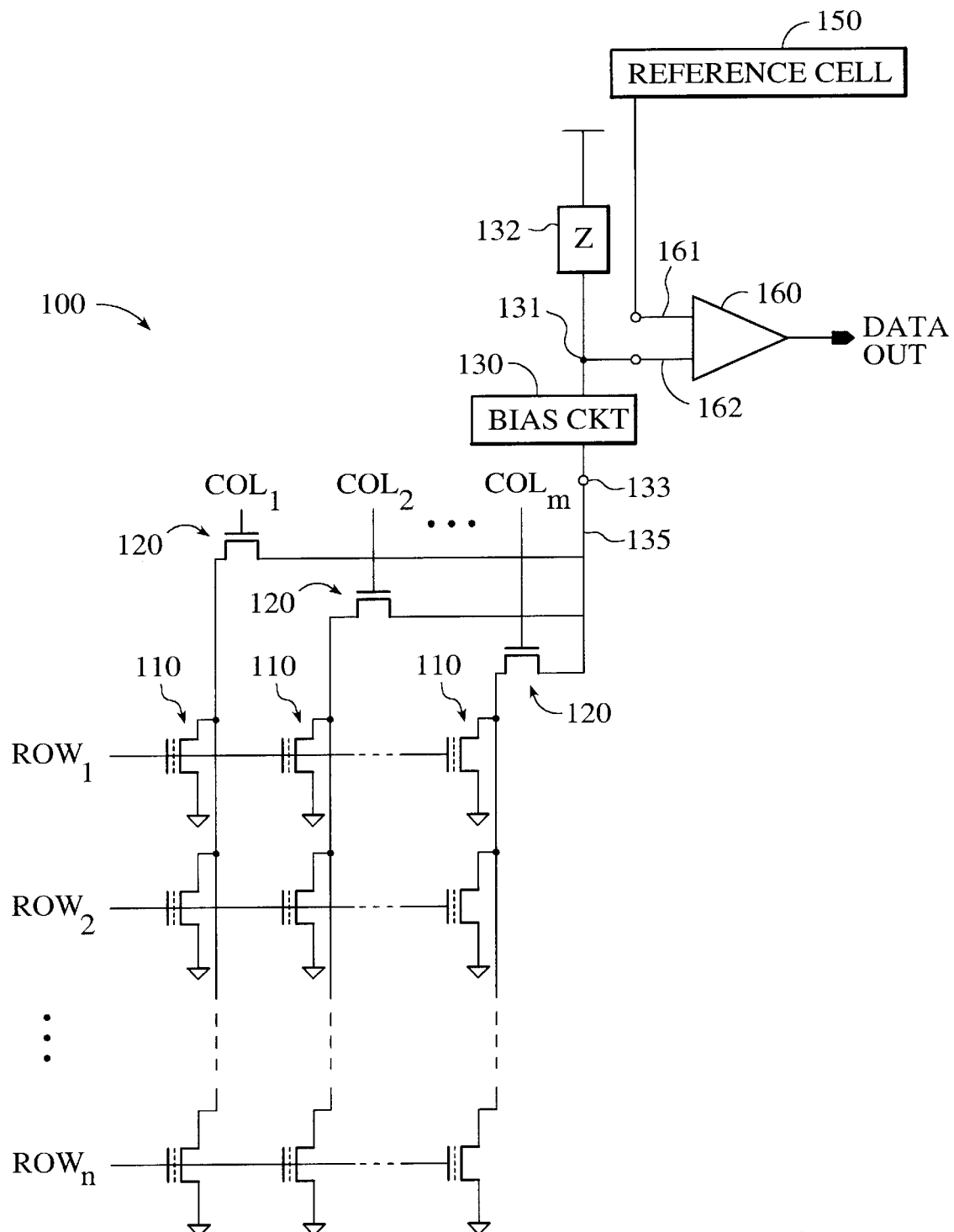
FIGS. 4–8 each illustrate a prior art bit clamping schemes.
Figure 5:
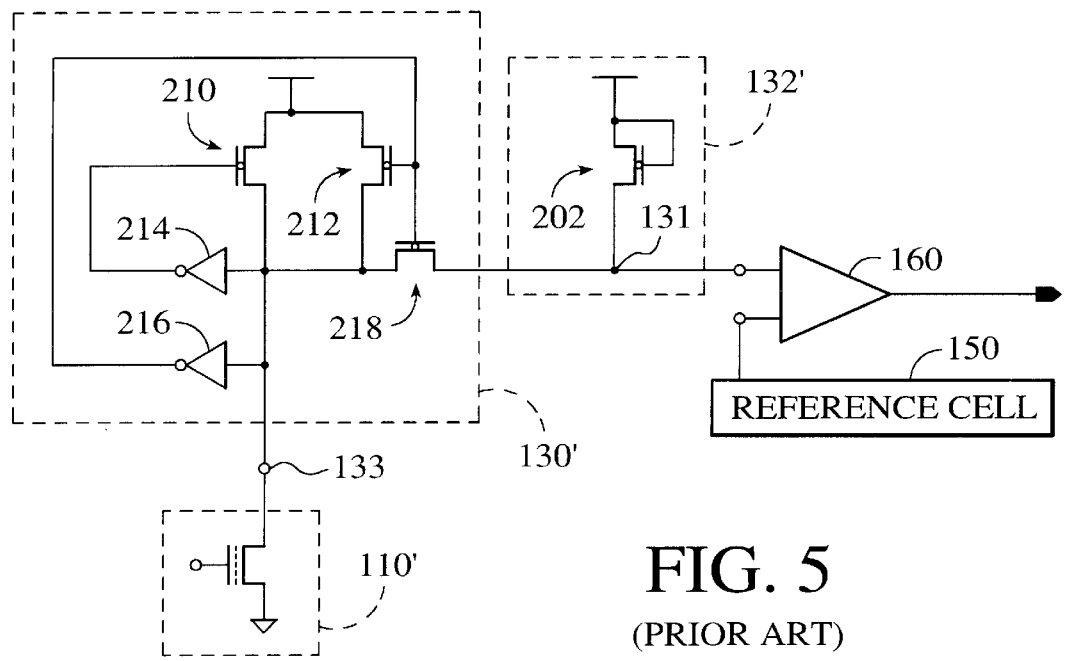
Figure 6:
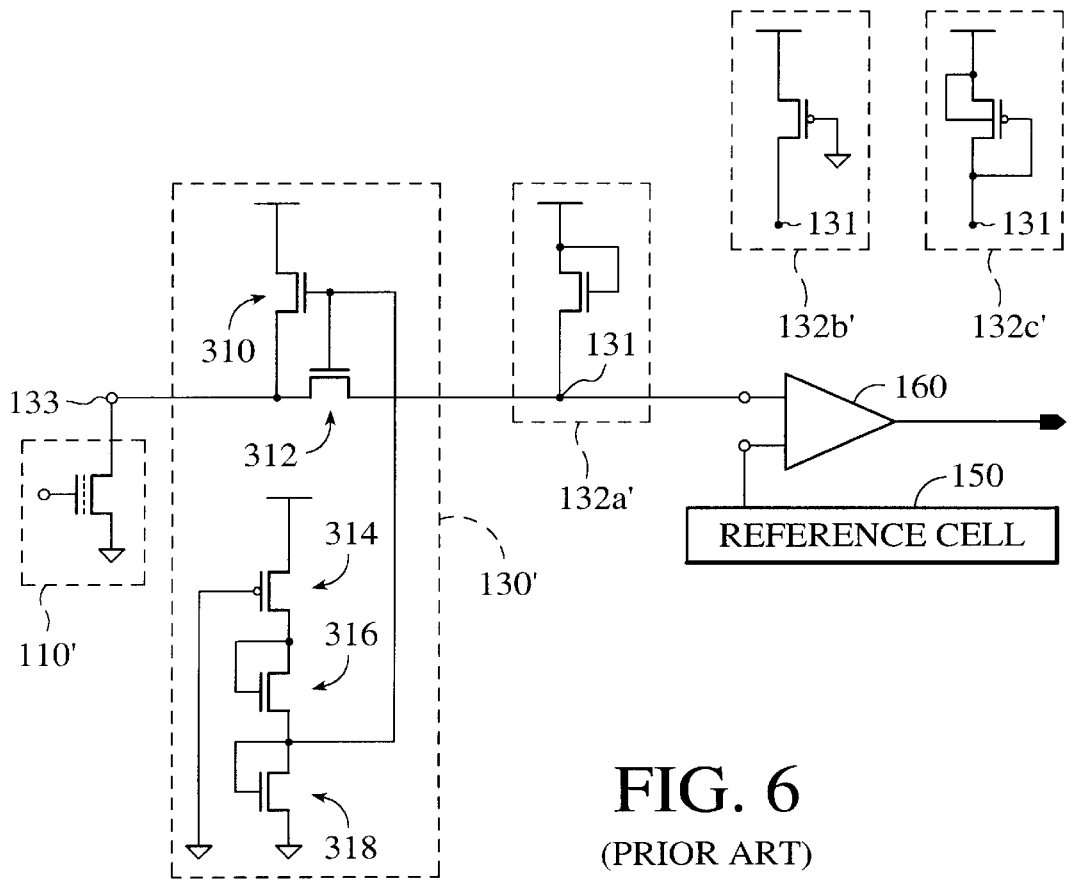
Figure 7:
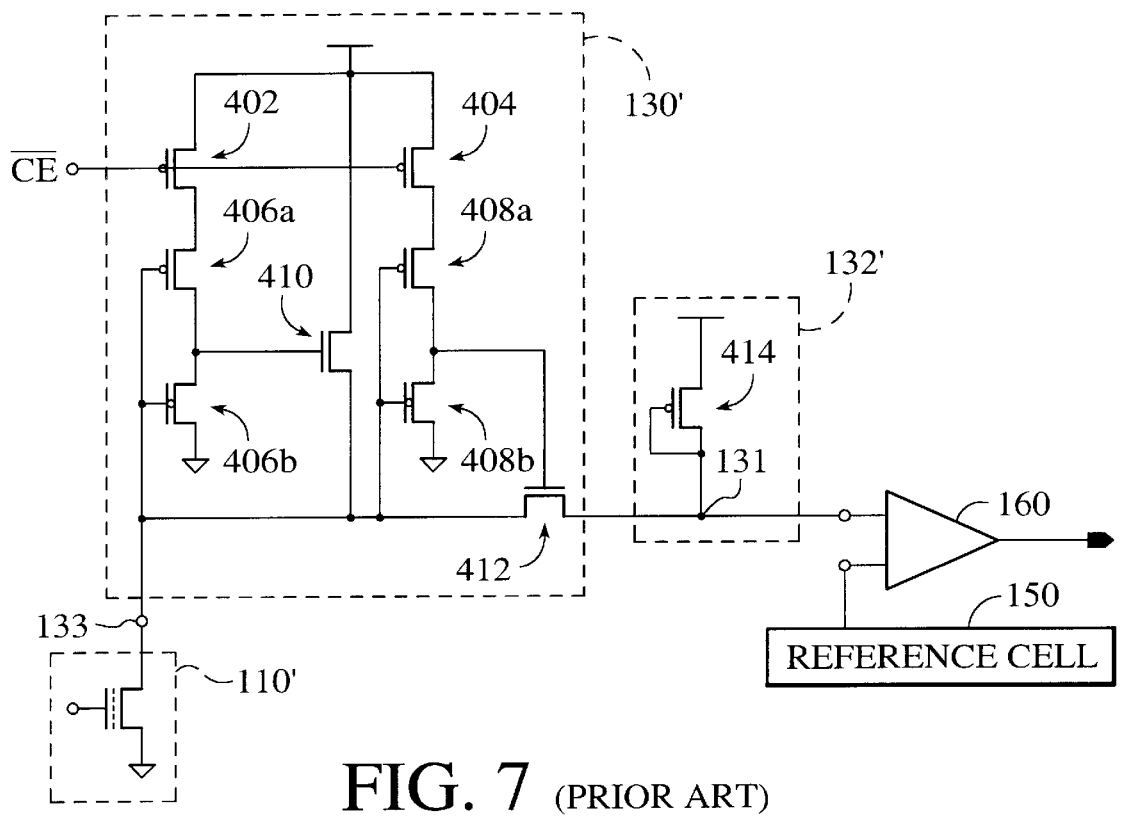
Figure 8:
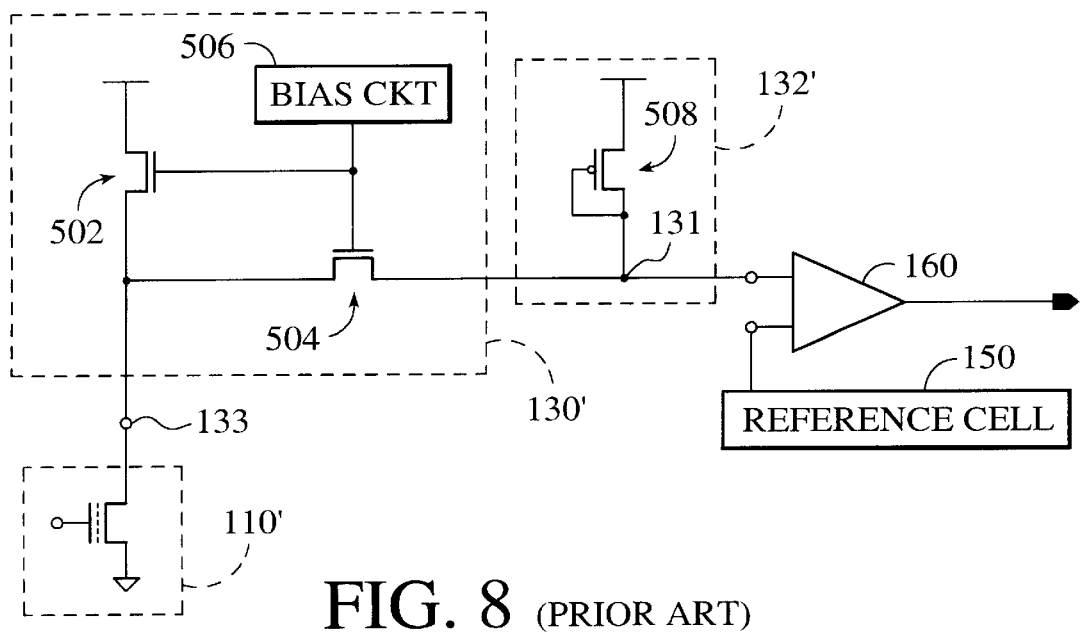

Operation of the present invention will now be discussed with reference to FIGS. 1 and 3. The graph shown in FIG. 3 is the transfer curve of a typical NMOS depletion-mode device. As with any FET, the device cuts off when the gate-to-source voltage $V_{GS}$ falls below $V_t$. An NMOS depletion device, however, is further characterized by having a negative threshold voltage ($V_t$), as shown in the figure.

Refer now to FIG. 1 and consider first the situation where a selected memory cell 112 is in the erased state. In this case the memory cell is conductive so that when it is selected, node 33 of bit line 35 is driven to ground. The voltage $V_{bitline}$ at node 33 is substantially equal to ground potential. The gate-to-source potential $V_{GS}$ of the depletion device, therefore, is approximately equal to zero volts and so the device is conductive, see FIG. 3. The sense node 31, therefore, is driven to ground potential.

Consider next the situation where the selected memory cell 112 is in the programmed state. The selected memory cell 112 is not conductive in this case, so that the potential $V_{bitline}$ at node 33 will begin to rise as charge accumulates at the node. Since the control gate of the depletion device 30 is at ground potential, its gate-to-source voltage is: $V_{GS}=0-V_{bitline}$; i.e. $V_{GS}=-V_{bitline}$. Suppose then that the depletion device 30 is constructed to have a $V_t$ (see FIG. 3) of -1.5 volts. As $V_{bitline}$ continues to rise, it will eventually reach 1.5 volts. At that point the depletion device cuts off, thus preventing further charge build-up at node 33 and limiting the maximum potential at node 33 to 1.5 volts. As mentioned above, this behavior is precisely the desired effect needed to avoid read disturb errors.

Since the control gate of the depletion device is tied to ground, there is no power burning circuitry needed for biasing the device. Moreover, the cutoff threshold $V_t$ of the device is completely insensitive to fluctuations in $V_{cc}$, so that the functionality of the bit line clamp will not be affected by such fluctuations. In addition, this scheme guarantees that $V_{bitline}$ will not exceed 1.5 volts, so that operation of the device will not be affected by fluctuations in $V_{cc}$. A memory device constructed in accordance with the present invention, therefore, will be readily adaptable to both high voltage (5 volt) and low voltage (3.3 and 2.5 volt) systems with no adverse affects on performance. Since the actual maximum $V_{bitline}$ value is determined by the device geometry and doping of the depletion device, it is an easy matter to provide a bit line clamp having a certain voltage threshold $V_t$ to limit $V_{bitline}$ to a given voltage level.

I claim:

1. A memory device comprising:
   at least one floating gate memory cell;
   select means, coupled to said memory cell, for receiving an address and for selecting a memory cell corresponding to a received address;
   a sense circuit; and
   a depletion-mode field effect transistor having a first terminal coupled to said sense circuit, a second terminal coupled to said select means, and a gate terminal coupled to a ground rail.

2. The memory device of claim 1 wherein said select means includes a column select transistor having a first terminal coupled to said second terminal of said depletion-mode transistor, a second terminal coupled to said memory cell, a gate terminal coupled to a column select line.

3. The memory device of claim 2 wherein said depletion-mode transistor is an NMOS device.

4. The memory device of claim 1 wherein said sense circuit further includes a second input, the memory device further including a load circuit having a first terminal coupled to said second input of said sense circuit and a second terminal coupled to a power supply rail.

5. The memory device of claim 4 wherein said load circuit is an enhancement-mode PMOS device and said depletion-mode transistor is an NMOS device.

6. The memory device of claim 4 wherein said load circuit is an enhancement-mode NMOS device and said depletion-mode transistor is an NMOS device.

7. A non-volatile memory device comprising:
   an array of floating gate memory cells arranged in rows and columns;
   row select means for selecting one of said rows of memory cells;
   column select means for selecting one of said columns of memory cells;
   a circuit having a data node for providing a data signal representative of the data stored in a selected memory cell, said circuit further having a load element and a depletion-mode transistor, said load element coupled between a power supply terminal and said data node, said depletion-mode transistor coupled between said data node and a column of said memory cells via said column select means, said depletion-mode transistor having a gate coupled to a ground terminal; and
   a sense amp coupled to said data node to sense a data signal thereat.

8. The memory device of claim 7 wherein said column select means is a many-to-one multiplexer having inputs coupled to said columns of memory cells and an output coupled to said depletion-mode transistor.

9. The memory device of claim 8 wherein said depletion-mode transistor is an NMOS device.

10. The memory device of claim 9 wherein said load element is either a PMOS device or an NMOS device.

11. The memory device of claim 7 wherein said columns of memory cells are arranged as a plurality of groups of columns, and said memory device further includes a plurality of said circuits and a means for selecting one of said groups of columns and for coupling a selected group of columns to said circuits.

12. The memory device of claim 11 wherein said load element of each of said circuits is either a PMOS device or an NMOS device.

13. The memory device of claim 12 wherein said depletion-mode transistor of each of said circuits is an NMOS device.

14. A semiconductor memory comprising:
    at least one column select line;
    at least one word select line;
    at least one floating gate memory cell having a first terminal, a second terminal coupled to a ground rail, and a gate coupled to said at least one word select line;
    a column select transistor having a first terminal, a second terminal coupled to said first terminal of said memory cell, and a gate coupled to said at least one column select line;
    a depletion-mode transistor having a first terminal, a second terminal coupled to said first terminal of said column select transistor, and a gate coupled to said ground rail;
    a load circuit having a first terminal coupled to a power supply rail and a second terminal coupled to said first terminal of said depletion-mode device; and
    a sense amp coupled to said first terminal of said depletion-mode device.

15. The semiconductor memory of claim 14 wherein said depletion-mode transistor is an NMOS device, said load circuit is an enhancement-mode PMOS device, and a gate terminal of said PMOS device is coupled to said ground rail.

16. The semiconductor memory of claim 14 wherein said depletion-mode transistor is an NMOS device, said load circuit is an enhancement-mode NMOS device, and a gate terminal of said NMOS device is coupled to said power supply rail.

* * * * *